United States Patent
Niuya et al.

(10) Patent No.: US 6,838,370 B1
(45) Date of Patent: Jan. 4, 2005

(54) METHOD OF MANUFACTURING SEMICONDUCTOR DEVICE AND MANUFACTURING APPARATUS

(75) Inventors: Takayuki Niuya, Tsukuba (JP); Michihiro Ono, Singapore (SG); Hideto Goto, Tsukuba (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/658,193

(22) Filed: Sep. 8, 2000

Related U.S. Application Data

(63) Continuation of application No. PCT/JP00/03544, filed on Jun. 1, 2000.

(30) Foreign Application Priority Data

Jun. 1, 1999 (JP) .......................................... 11-154055

(51) Int. Cl.[7] .......................................... H01L 21/4763
(52) U.S. Cl. .................. 438/623; 438/618; 438/778; 438/780; 438/620; 438/622; 438/637; 438/638; 438/643; 438/645; 438/674
(58) Field of Search ................................. 438/618, 584, 438/597, 620, 622, 623, 637, 638, 643, 645, 674, 675, 679, 687, 778, 780, 782, 902, 629, 631

(56) References Cited

U.S. PATENT DOCUMENTS 5,736,770 A * 4/1998 Asai et al. .................. 257/382
5,795,828 A * 8/1998 Endo et al. .................. 438/678
6,150,257 A * 11/2000 Yin et al. .................... 438/622
6,150,270 A * 11/2000 Matsuda et al. ............. 438/687
6,153,521 A * 11/2000 Cheung et al. ............. 438/687
6,323,131 B1 * 11/2001 Obeng et al. ............... 438/687
6,350,687 B1 * 2/2002 Avanzino et al. ........... 438/687

FOREIGN PATENT DOCUMENTS

| JP | 5-315331 | 11/1993 |
| JP | 8-64594 | 3/1996 |
| JP | 10-163208 | 6/1998 |
| JP | 11-154653 | 6/1998 |
| JP | 10-229084 | 8/1998 |

* cited by examiner

*Primary Examiner*—George Fourson
*Assistant Examiner*—Julio J. Maldonado
(74) *Attorney, Agent, or Firm*—Finnegan, Henderson, Farabow, Garrett & Dunner, L.L.P.

(57) ABSTRACT

The present invention is directed to suppressing the rise of a dielectric constant of insulating film during a procedure of burying wiring in semiconductor devices by using a damascene process, and it is also directed to simplifying a process of manufacturing the semiconductor devices. In terms of a process step of forming protection film on a metal layer during the damascene process, there is employed a combined arrangement of a wash unit where particles are removed from polished substrates with a processing unit where a solution containing an organic substance such as benzotriazole, which tends to be bound to the metal layers, is applied to the metal layers over the substrates after the particles are removed therefrom. For the combined arrangement of the processing unit and the wash unit, either a batch processing unit or a mono/serial processing unit can be employed.

7 Claims, 8 Drawing Sheets

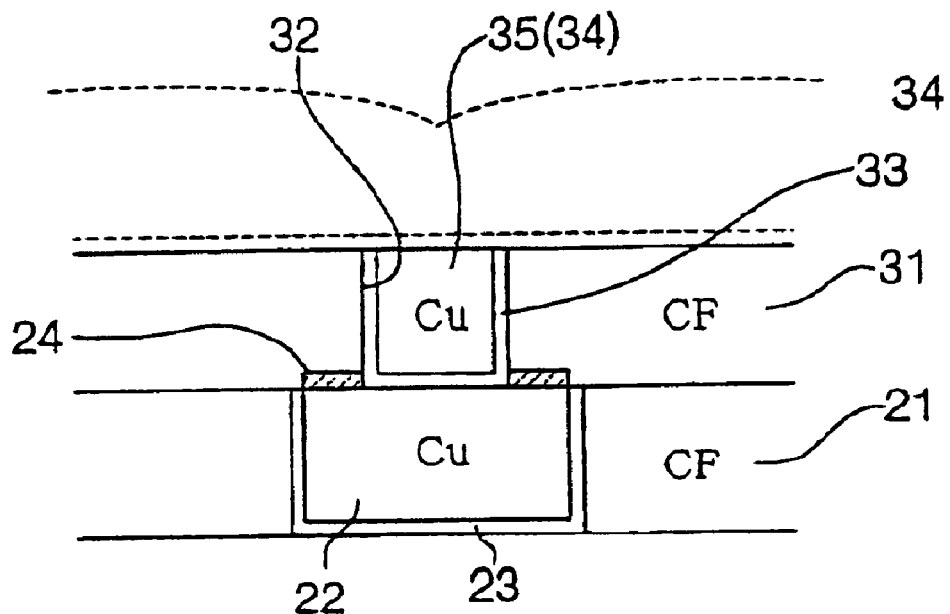
F I G. 2A
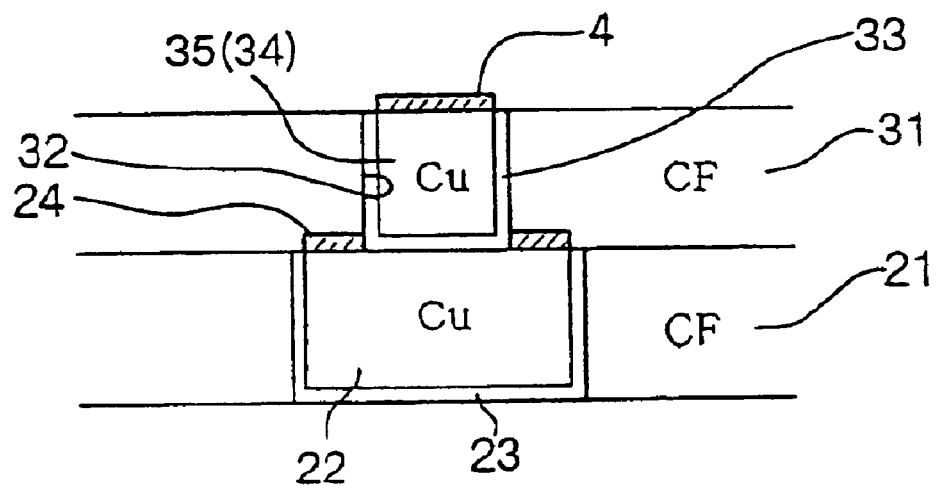
F I G. 2B

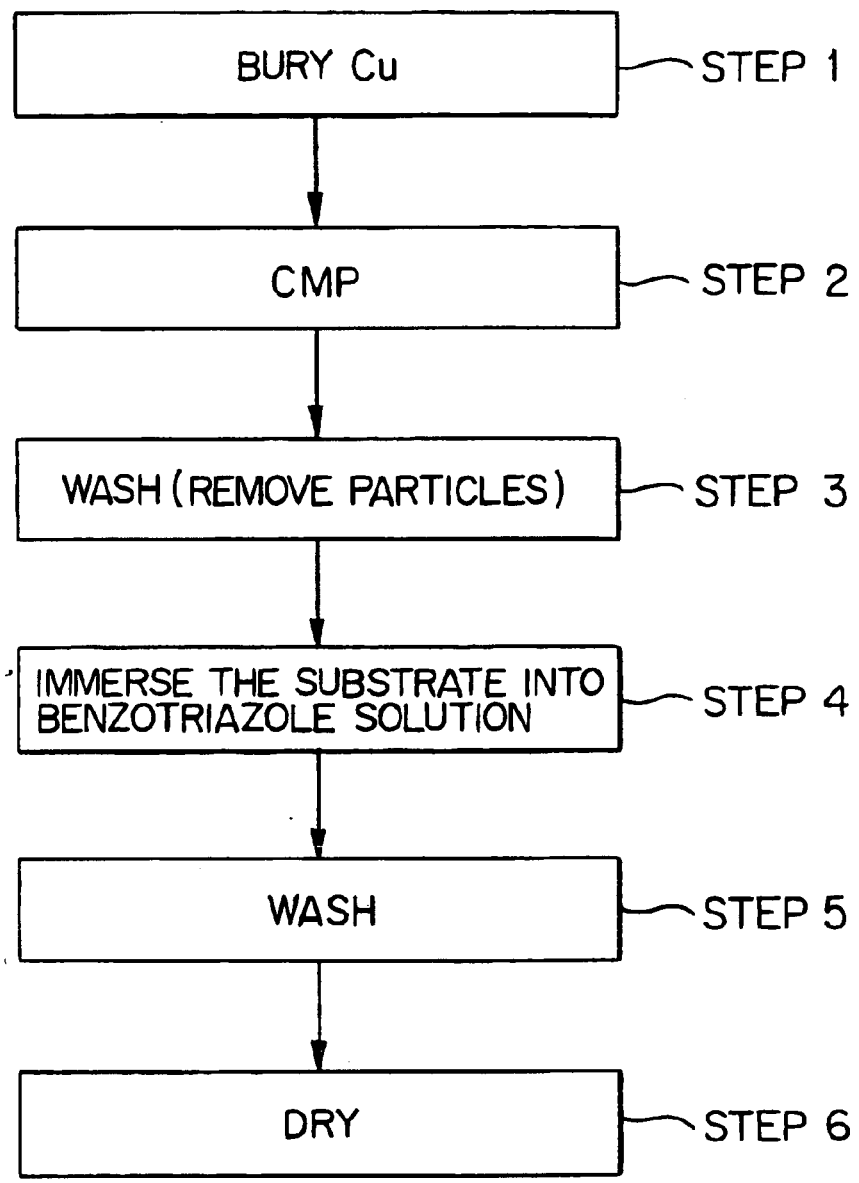
F I G. 3

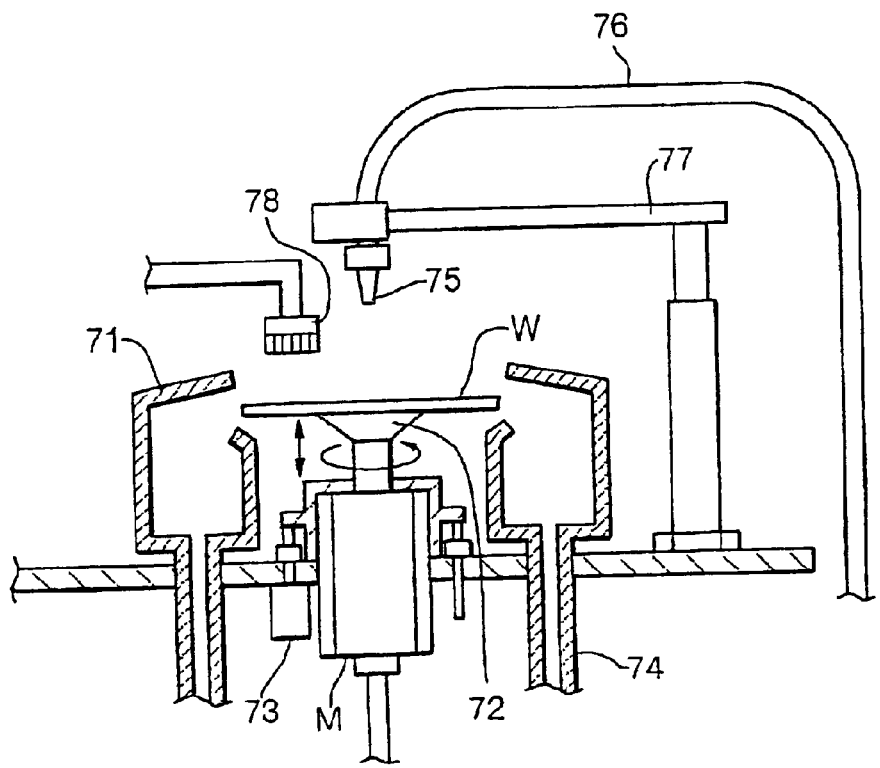
F I G. 7
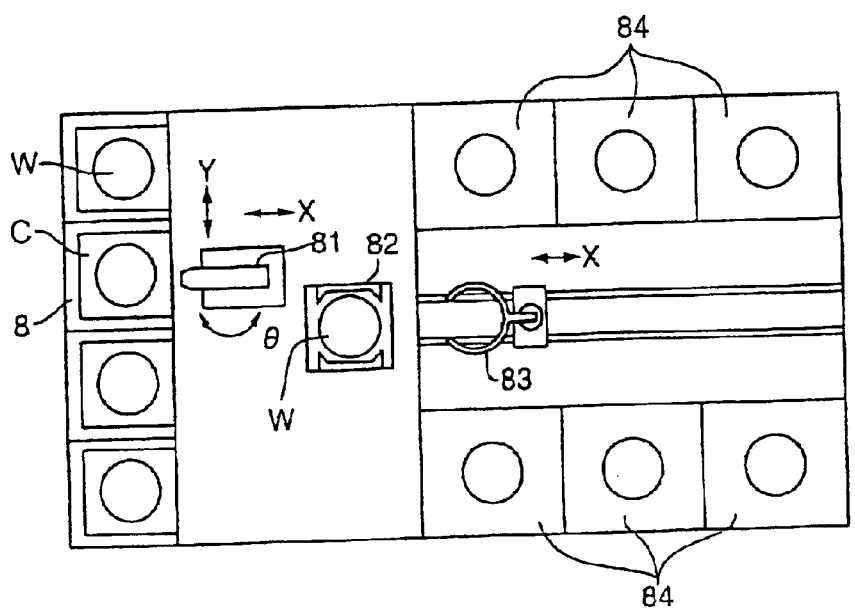
F I G. 8

METHOD OF MANUFACTURING SEMICONDUCTOR DEVICE AND MANUFACTURING APPARATUS

CROSS-REFERENCE TO RELATED APPLICATION

This application is a Continuation of International Application No. PCT/JP00/03544, filed Jun. 1, 2000.

TECHNICAL FIELD

The present invention relates to a technology of forming protection film on a surface of a metal embedded to serve as wiring in semiconductor devices.

BACKGROUND ART

Wiring technology in which copper lines are substituted for aluminum lines have recently become popular because of needs and wants of enhanced performances of semiconductor devices. Copper has advantageous features of being lower in resistance and superior in electro-migration tolerance (EM tolerance) as compared with aluminum while having disadvantageous features of greater possibility of diffusion into semiconductor substrate and higher liability to be oxidized. In order to cope with such problems, various types of barrier materials referred to as barrier metals or protection films are formed between multi-layered wiring copper and interlayer insulating film (hereinafter referred to as "insulating film") in the semiconductor devices.

One of methods for implementing multi-layered wiring of copper as mentioned above is damascene process, and FIGS. 9A, 9B, 9C, and 9D illustrate sequential steps of the process. Reference numeral 11 in the drawings denotes first insulating film of $SiO_2$, and after the insulating film 11 along with concavity 12 defined to embed wiring is coated with a barrier material (barrier metal) 13 such as TaN or TiN, wiring copper (Cu) buries the concavity (see FIG. 9).

The surface of the substrate is polished by means of a polishing procedure referred to as chemical mechanical polishing (CMP) to eliminate the copper 14 and barrier metal 13 except for those in the concavity 12, and after forming protection film or silicon nitride film (referred to as SiN film hereinafter) 15 so as to close an opening of the concavity 12, second insulating film 16 is formed thereon (see FIG. 9B). The SiN film 15 is useful to prevent the copper 14 from diffusing into the second insulating film 16. With a mask (not shown), the insulating film 16 is partially etched away to define a second groove 17 (see FIG. 9C). Moreover, after the SiN film 15 in the groove 17 is etched away (see FIG. 9D), the second groove 17 is buried with copper, and these steps are repetitively carried out to implement a multi-layered configuration.

However, the SiN film 15 serving as the protective film in the above-mentioned damascene process has a high dielectric constant, and the residual SiN film remaining between the insulating films 11 and 16 disadvantageously causes the dielectric constant to be raised as a whole in the interlayer insulating film even if the interlayer insulating film is made of a material with a low dielectric constant.

Moreover, if the SiN film is used as the protection film, then etching must be conducted twice for removing the SiN film 15. More specifically, the second insulating film 16 is first etched to make a second groove 17, and thereafter, the SiN film 15 must undergo etching under different process conditions, by exchanging processing gas used in the etching, for example. The SiN film is formed through chemical vapor deposition (CVD), and this also disadvantageously leads to complicating the total manufacturing process.

SUMMARY OF INVENTION

Accordingly, it is an object of the present invention to provide a manufacturing method of semiconductor devices and a manufacturing apparatus of same, which can simplify the manufacturing process without raising the dielectric constant of an insulating film in a procedure of burying wirings using a damascene process.

According to another aspect of the invention the method involves making a first concavity in a first insulating film on a surface of a substrate and burying the first concavity covered with the barrier layer for the purpose of preventing the metal diffusion with wiring metal. The substrate is then polished to remove a part of the metal residing higher than the upper peripheral level of the first concavity so as to leave a first metal layer in the first concavity. A solution of an organic substance is applied tending to be bound to the metal layer onto the surface of the substrate so as to form protective film of the organic substance on the surface of the first metal layer for preventing metal diffusion. As second insulating film is formed on the surface of the substrate and the second insulating film is directly connected to the first insulating film. A second concavity is made in the second insulating film in a region above the first metal layer; and the second concavity covered with the barrier layer is buried by a second wiring metal layer to be connected to the first metal layer.

The protective film serves to prevent metals from diffusing from the first metal layer into the second insulating film upon the formation of the second insulating film on the first metal layer, and the procedure of forming the protection film is thus simplified since the protective film is formed by applying the solution onto the surface of the substrate. In addition to that, in an area where the first metal layer does not exist, or an area where there is no essential need of forming the protection film, the protective film is not formed. Thus, adverse effects of the protective film on the dielectric constant of the insulating film can be avoided. Furthermore, since the protective film can be simultaneously eliminated together with the second insulating film when it is etched away, the manufacturing process is thus simplified without the need for repeating a procedure of the etching twice.

According to yet another aspect of the invention, the organic substance is a triazole compound.

According to another aspect of the invention, the organic substance is selected from the group consisting of alicyclic alcohol compounds, saccharides, aromatic ring phenol compounds, aromatic ring carboxylic acid compounds, aliphatic carboxylic acid compounds and derivatives thereof, aminopolycarboxylic acid compounds, phosphoric acid compounds, alkanolamine compounds, aromatic ring amine compounds and aliphatic amine compounds.

According to another aspect of the invention, the method involves making a first concavity in a first insulating film on a surface of a substrate; burying the first concavity covered with the barrier layer for the purpose of preventing metal diffusion with wiring metal and polishing the substrate to remove a part of the metal residing higher than the upper peripheral level of the first concavity so as to leave a first metal layer in the first concavity. A solution of organic substance tending to be bound to the metal layer is applied onto the surface of the substrate so as to form on the surface of the first metal layer a protective film for preventing metal diffusion. The protective film comprises at least one of stannous chloride, stannous borofluoride, stannous sulfate, nickel sulfate, nickel chloride and nickel sulfaminate. A second insulating film is formed on the surface of the substrate and the second insulating film is directly connected to the first insulating film. A second concavity is formed in the second insulating film in a region above the first metal layer, and the second concavity covered with the barrier layer is buried with a second wiring metal layer to be connected to the first metal layer.

According to another aspect of the invention, the wiring metal is copper.

According to another aspect of the invention, the washing the polished substrate to remove the metal residing higher than the upper peripheral level of the first concavity is done so as to leave the first metal layer in the first concavity.

According to another aspect of the invention, a carry-in unit is provided where a substrate cassette receiving a substrate is carried in and the substrate has a metal layer formed in a concavities in a insulating film on the substrates. A first washing unit is also provided where a surface of the substrate is washed and a processing unit is provided where the solution of organic substance tending to be bound to the metal layer is applied onto the surface of the substance so as to form protection film on the surface of the metal layer for preventing metal diffusion. Also a carrying unit is provided where the substrate is unloaded from the substrate cassette carried in the carry-in unit, and carried among the units from one to another.

According to another aspect of the invention, the device further includes a second washing unit where the processed substrate in the processing unit is washed with a washing liquid and a drying unit where the substrate washed therein is dried.

According to another aspect of the invention, the first washing unit, the processing unit, the second washing unit, and the drying unit are arranged as a series of processing vessels with the carrying unit transporting the substrate among the plurality of processing vessels.

BRIEF DESCRIPTION OF THE DRAWINGS

FIGS. 2A and 2B are cross-sectional views illustrating conditions of the semiconductor substrate according to a preferred embodiment of the present invention;

FIG. 3 is a diagram showing a process step of forming a protection film on a surface of a metal layer;

FIG. 7 is a diagram showing a whole single wafer processing unit for forming an insulating film on a semiconductor substrate;

FIG. 8 is a plan view showing a semiconductor manufacturing apparatus having the single wafer processing unit incorporated therein.

BEST MODES FOR CARRYING OUT THE INVENTION

A preferred embodiment of the manufacturing method of semiconductor devices according to the present invention will be described, focusing on an example of a single damascene process for simplifying the description, with reference to FIGS. 1A, 1B, 1C, 1D, 2A and 2B.

Figure 1A:
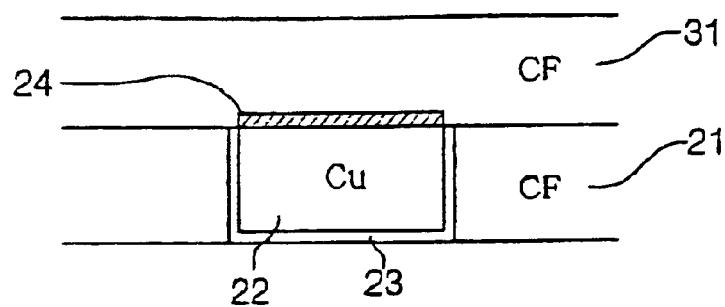
FIGS. 1A, 1B, 1C, and 1D are cross-sectional views illustrating, step by step, conditions of a semiconductor substrate according to a preferred embodiment of the present invention.
Figure 1B:
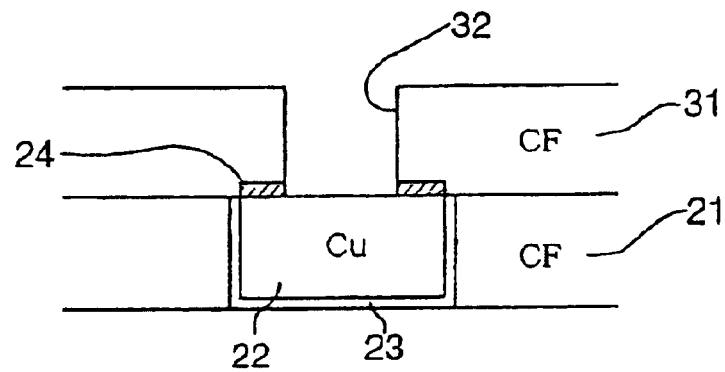

FIGS. 1A through 1D illustrate process steps of making through-holes above wiring (metal layer) which extends in circuitry at the n-th level stacked on the substrate to make wiring line (which is also referred to as "wiring" in this embodiment) which connects to wiring in circuitry at the (n+1)th level. In FIGS. 1A through 1D, reference numeral 21 refers to an insulating film (interlayer insulating film) at n-th level formed of fluorine-contained carbon film (CF film) of a low dielectric constant, for example, 22 to a metal layer serving as wiring and made of copper in circuitry at the n-th level, 23 to a barrier layer preventing copper from diffusing into the insulating film 21, and 24 to a protection film explained later in greater detail. FIG. 1A illustrates a state where the first insulating film 31 is formed on the n-th level circuitry. As shown in FIG. 1B, a pattern mask of a photo resist is first applied to the first insulating film 31 and undergoes etching to make a first concavity or a first groove 32. In the etching procedure, the protection film 24 is also etched away as again explained later.

Figure 1C:
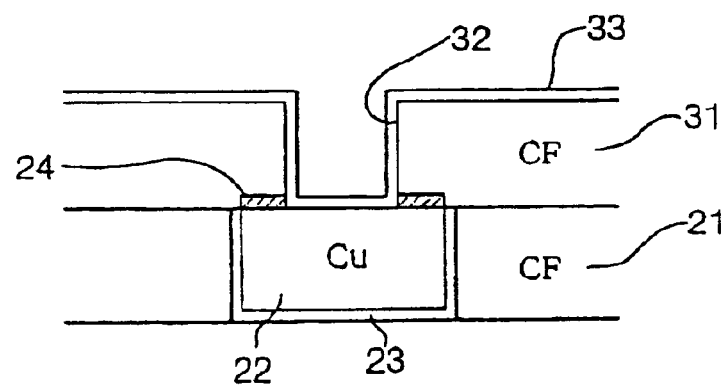
Figure 1D:
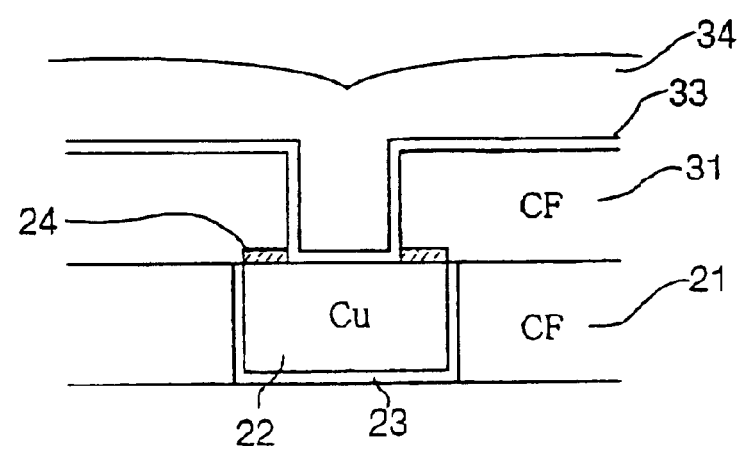

Then, as shown in FIG. 1C, a first barrier layer 33 is formed on a surface of the substrate, namely, surfaces of the first insulating film 31 and first groove 32 to prevent copper buried in a subsequent process step from diffusing and being oxidized. The first barrier layer 33 is formed by a process such as sputtering, using $Ta_2O_5$ (Tantalum Oxide), TaN (Tantalum Nitride), TiN (Titanium Nitride), etc. As shown in FIG. 1D, copper is deposited on the surface of the substrate by sputtering to bury the first groove 32 with the copper 34. After that, as shown in FIG. 2A, the surface of the substrate is polished by CMP to remove the copper 34 and barrier layer 33 residing higher than the upper peripheral level of the first groove 32, so that the copper 34 is left only within the groove 32 to define the first metal layer 35. CMP is a process in which semiconductor wafer fixed on a turn table is rotated while being pressed against polishing cloth and being supplied with liquid abrasives, so as to gain both chemical and mechanical polishing effects. Next, as shown in FIG. 2B, the protection film 4 is formed on the first metal layer 35.

FIG. 3 is a diagram showing a process of forming the protection film 4 where after burying the copper (STEP 1), CMP is conducted (STEP 2), and thereafter, the substrates having impurities on their surfaces as a result of CMP are washed (STEP 3) to remove particles of the impurities. Then, a benzotriazole solution (chemical) is applied to the substrate, for example, by dipping the substrate into the chemical (STEP 4), and the substrate is dried. Benzotriazole makes a reaction to produce complex compound and is bound to the surface of the copper 34, and the benzotriazole residing in any region other than the copper is washed away by the washing (STEP 5). Then, the substrate is dried (STEP 6), and consequently, the protection film 4 of benzotriazole is formed on the surface of the copper.

After that, a second insulating film is formed in similar procedures as in FIG. 1A, and then, a groove is defined in the insulating film to be buried with a second metal layer of copper serving as wiring in the circuitry at the (n+1)th level. Since the protection film 4 is made of benzotriazole, the protection film 4 under the insulating film is removed simultaneously with the insulating film that is etched away to make the groove. As to etching gas in this situation, fluorocarbon gas ($CF_4$) is preferably used.

In the above mentioned embodiment, the damascene process can be simplified since the protection film 4 can be formed on the copper 34 in a simple procedure, and since the protection film 4 can be etched simultaneously when the insulating film 31 is etched. The protection film 4 remains only on the surface of the copper 34 and is bound thereto, and hence, the insulating film 31 is not superposed with the protection film that would affect the dielectric constant of the insulating film 31. In order to form the protection film 4, other complexing agents may be used which are capable of developing complexes in reaction with metals.

For instance, complexing agents which prevent copper ions from diffusing from the surface of the copper 34 into the insulating film 31 include o-tolyltriazole, p-tolyltriazole, and the like as well as the above-stated benzotriazole having a high capability of developing complexes in relation with the copper 34.

Additionally, other effective compounds serving as complexing agents include alicyclic alcohol compounds, saccharides, aromatic ring phenol compounds, aromatic ring carboxylic acid compounds, aliphatic carboxylic acid compounds and derivatives thereof, aminopolycarboxylic acid compounds, phosphonic acid compounds, alkanolamine compounds, aromatic ring amine compounds, aliphatic amine compounds, and the like.

The alicyclic alcohol compounds include 1,2-dihydroxycyclohexane and the like.

The saccharides include sorbitol, sucrose, starch, and the like.

The aromatic ring phenol compounds include phenol, o-cresol, m-cresol, p-cresol, resorcinol, 2,3-pyridinediol, 4,6-dihydroxypyridine, m-nitrophenol, catechol, pyrogallol, and the like.

The aromatic ring carboxylic acid compounds include benzoic acid, o-toluic acid, m-toluic acid, p-toluic acid, and the like.

The aliphatic carboxylic acid compounds include formic acid, acetic acid, propionic acid, butyric acid, isobutyric acid, valeric acid, isovaleric acid, caproic acid, trimethylacetic acid, acrylic acid, and the like.

The derivatives of the aliphatic carboxylic acid compounds include aliphatic carboxylic acid esters (e.g., ethyl acetate ester), aliphatic carboxylic acid amides (e.g., propionic acid amide), aliphatic carboxylic acid anhydrides (e.g., acetic anhydride), and the like.

The aminopolycarboxylic acid compounds include ethylenediaminetetraacetic acid (EDTA), 1,2-cyclohexanediaminetetraacetic acid (CyDTA), triethylenetetraaminehexaacetic acid (TTHA), nitrilotriacetic acid (NTA), and the like.

The phosphonic acid compounds include methyldiphosphonic acid, amino-tris, ethylidenephosphonic acid, 1-hydroxyethylidene-1,1 diphosphonic acid, 1-hydroxybutylidene-1,1-diphosphonic acid, ethyl amino-bis(methylenephosphonic acid), dodecylamino-bis (methylenephosphonic acid), nitrilotris (metylenephosphonic acid), ethylenediamine-bis (methylenephosphonic acid), ethylenediaminetetrakis (methylenephosphonic acid), hexenediaminetetrakis (methylenephosphonic acid), diethylenetriaminepenta (methylenephosophonic acid), or ammonium or alkali metal salts thereof, and the like.

The alkanolamine compounds include monoethanolamine and the like.

The aromatic ring amine compounds include aniline, 2-methylaniline, and the like.

The aliphatic amine compounds include methylamine, ethylamine, ethylenediamine, hydroxyamine, ethoxyamine, methylhydrazine, and the like.

Besides the compounds mentioned above, anthranilic acid, o-hydroxyaniline, gallic acid, gallic acid ester, and the like.

These compounds can be used singly or in a combination of two or more members.

Figure 4:
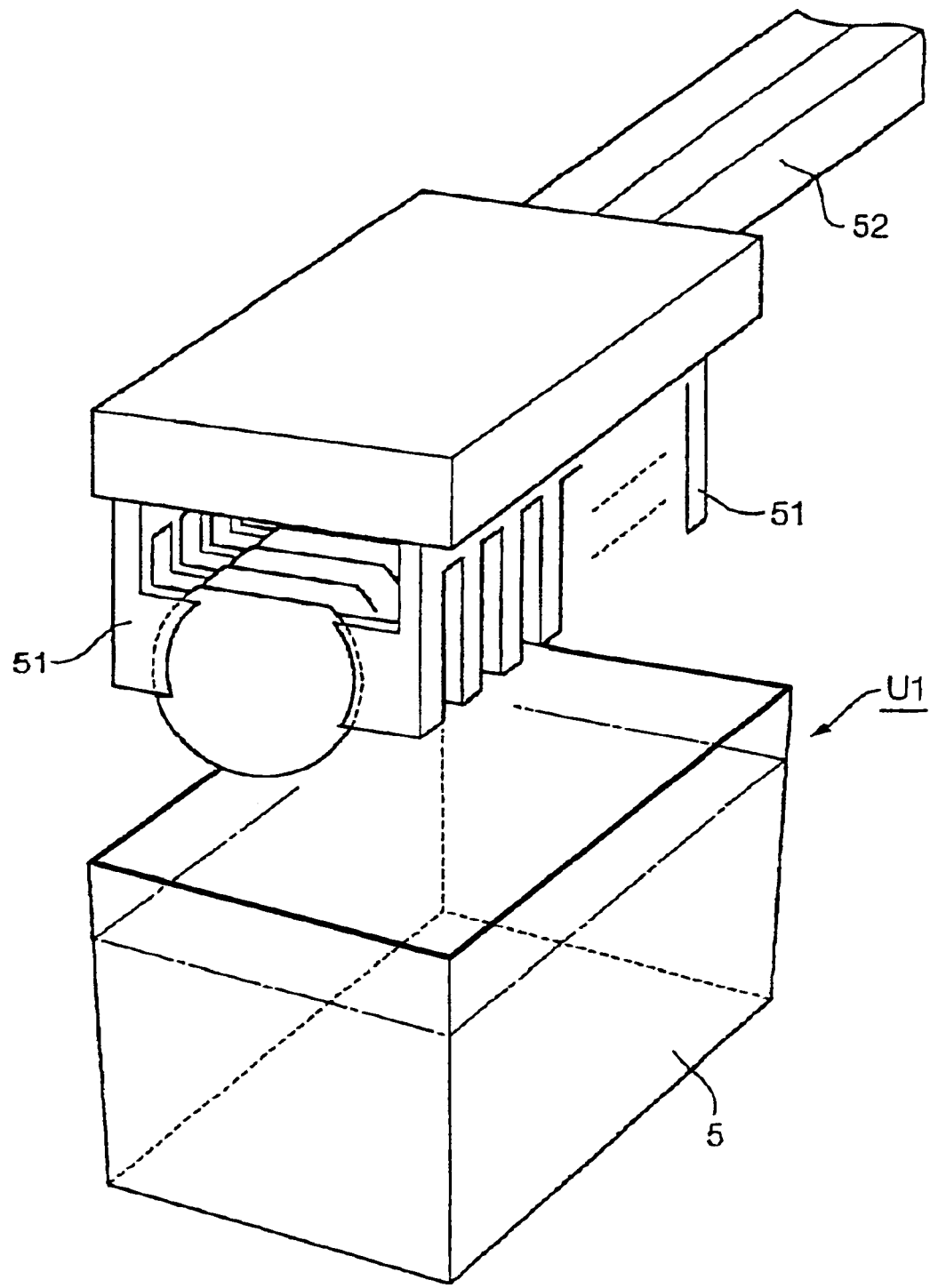
FIG. 4 is a perspective view showing a batch processing unit where an insulating film is formed on a semiconductor substrate.

An apparatus for applying benzotriazole onto the surface of the copper layer on the wafer will now described, taking the batch processing unit as an example. FIG. 4 is a diagram showing the processing unit designated as a processing unit U1, and the processing unit U1 includes processing vessel 5 filled with chemical containing benzotriazole, pairs of holding arms 51 which move laterally to open and close so as to grasp many (e.g. fifty) wafers W altogether from their opposite sides at a time, with the wafers standing vertical individually and in parallel with one another, and the unit also includes support arms 52 movable laterally and vertically.

When the holding arms 51 grasp the wafers W, a member not shown such as an elevating unit may be used to push up the twenty-five wafers from below the wafer cassette, and then, the wafers are to be grasped altogether by the holding arms 51. The holding arms 51 are divided into two groups each including 25 pairs of them, and they carry out the above-mentioned procedure twice to grasp fifty wafers in total. The holding arms 51 are lowered into the processing vessel 5 to immerse the wafers W into the chemical within the processing vessel 5. The processing vessel 5 is provided with a flow path or a pump that serves to feed an overflow of the chemical back to the processing vessel through its bottom portion although such flow path or pump is omitted in the drawings.

Figure 5:
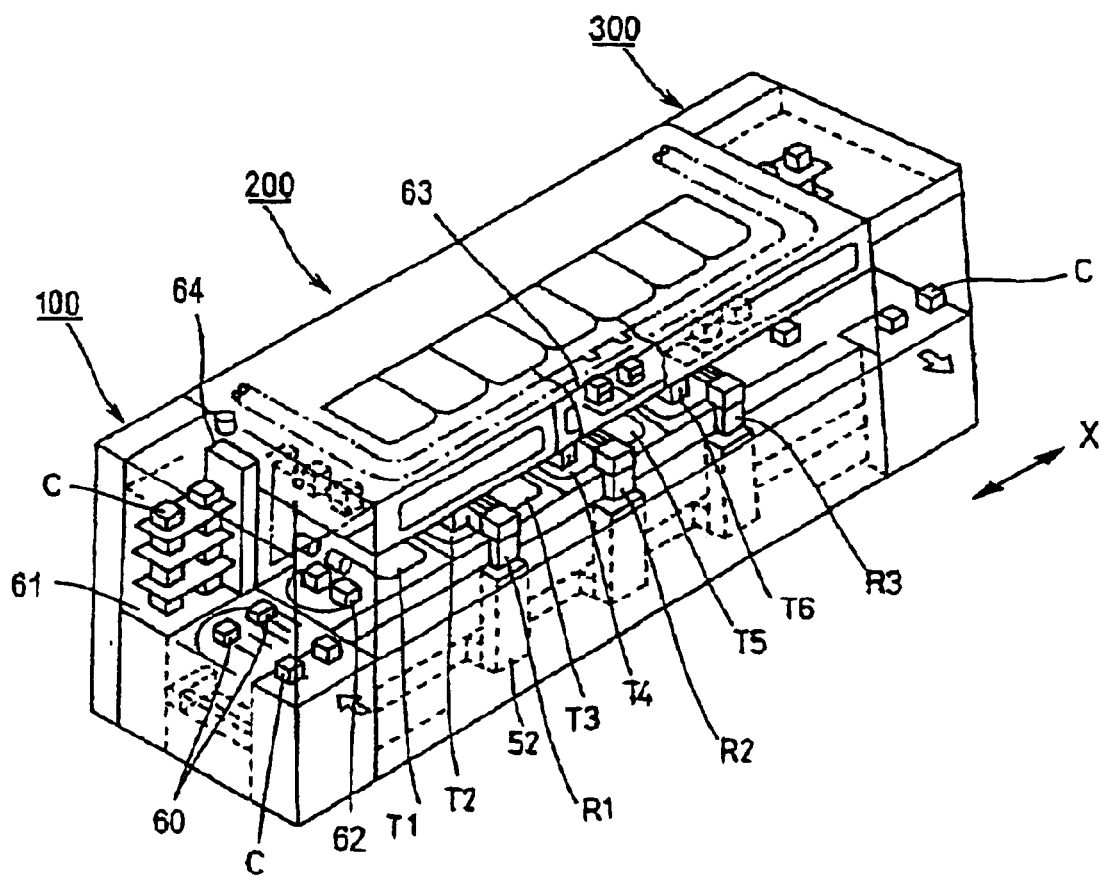
FIG. 5 is a perspective view showing a washing machine having the batch processing unit incorporated therein.

FIG. 5 illustrates an embodiment where the processing unit is incorporated in the semiconductor manufacturing apparatus. The apparatus is comprised of three zones including a carry-in unit 100 where substrates such as the wafers, prior to being washed, are carried in and housed in units of cassettes, a wash unit 200 where the wafers are washed, and carry-out unit 300 where each of the cassettes is unloaded after the wafers in the cassette are washed.

Figure 6:
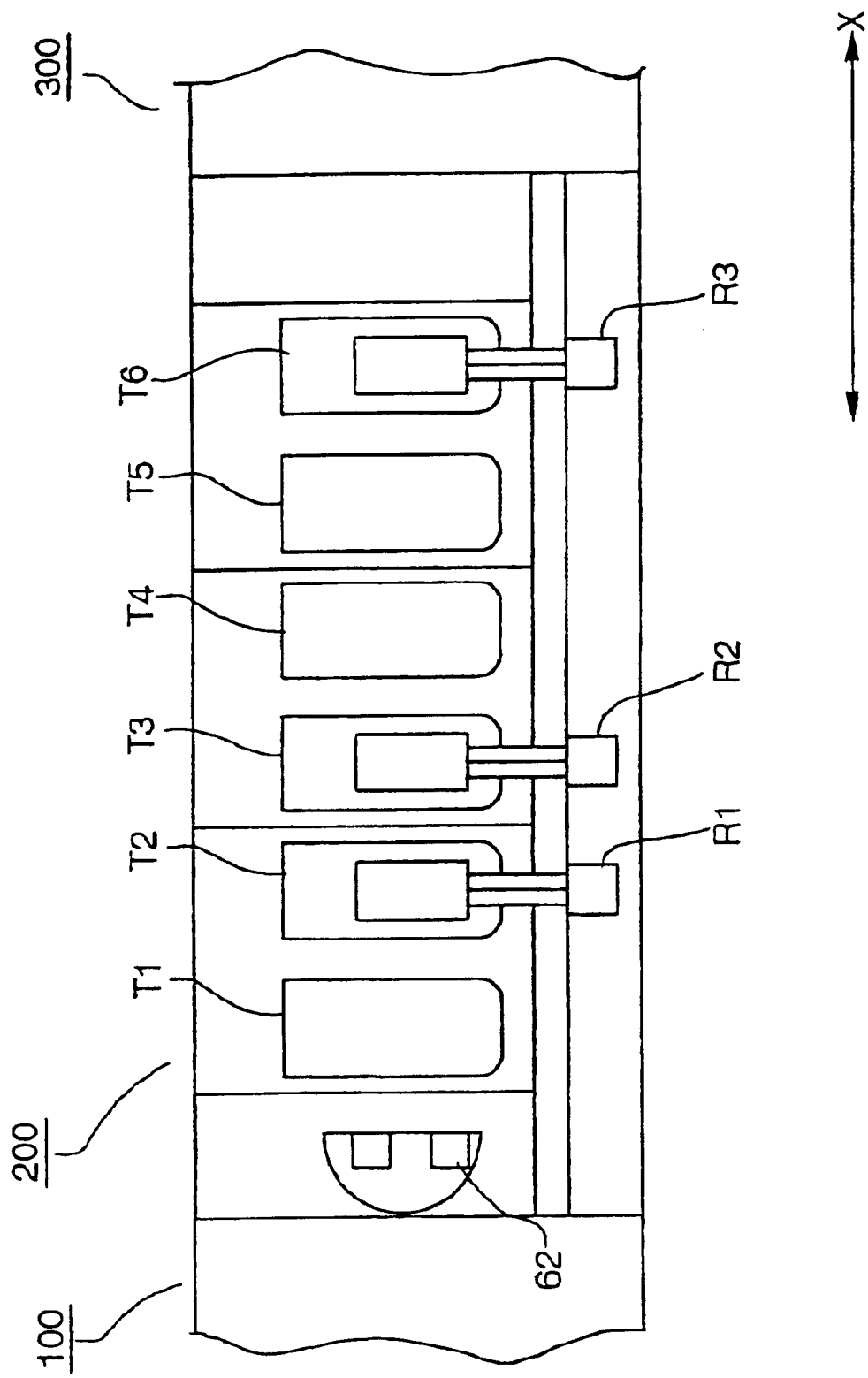
FIG. 6 is a schematic plan view showing a wash unit of a semiconductor manufacturing apparatus.
Figure 9A:
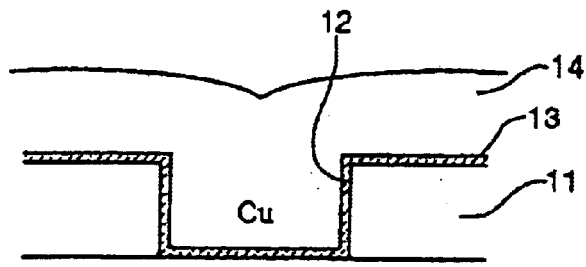
FIGS. 9A, 9B, 9C, and 9D are cross-sectional views showing semiconductor substrates, by way of explanation of a damascene process in a related invention.
Figure 9B:
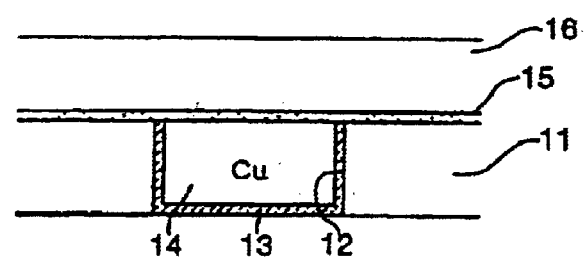
Figure 9C:
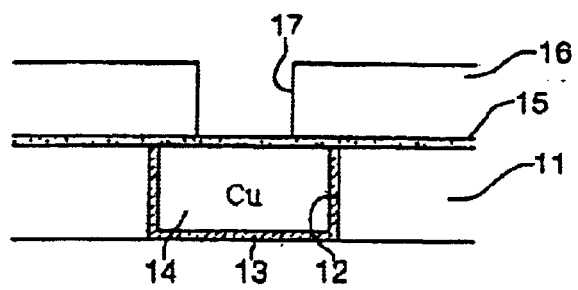
Figure 9D:
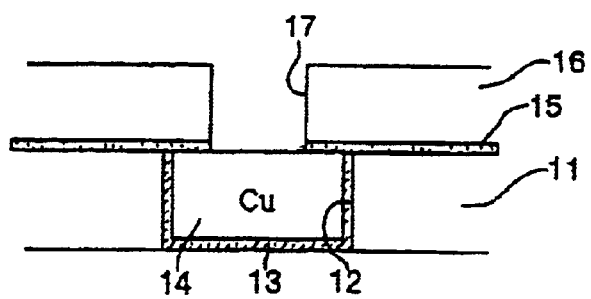

In the carry-in unit 100, once a cassette C loaded with many (e.g. twenty-five) wafers is carried in from the outside to a stand-by unit 61 by a cassette carrier means 60, it is transferred to a loader unit 62 where a wafer holding mechanism (holding arms) not shown removes the wafers from the cassette C into an intermediate housing. In the wash unit 200, a plurality of wafer carrier mechanisms (three of the wafer carrier mechanisms R1 through R3 are shown in the drawing for convenience) are arranged along a line connecting between the carry-in unit 100 and the carry-out unit 300 (in a direction X). A carrier unit is made up of the wafer holding arms and the wafer carrier mechanisms. Each of the wafer carrier mechanisms R1 through R3 includes the holding arms 51 and the support arm 52 as described above. There are arranged six of the processing vessels T1 through T6 along the direction X in the wash unit 200, where the wafer carrier mechanism R1 is dedicated to the processing vessels T1 and T2, the wafer carier mechanism R2 is dedicated to the processing vessels T3 and T4, and the wafer carrier mechanism R3 is dedicated to the processing vessels T5 and T6, respectively. FIG. 6 is a schematic plan view showing the wash unit 200.

The plurality of the processing vessels (the vessels designated by T1 through T6 only for reference) are assigned to those for washing the wafers which have undergone the CMP process, the ones for rinsing the wafers with pure water, the ones for processing the wafers with benzotriazole containing chemical therein, those for washing the chemical with liquid cleaner of IPA (isopropyl alcohol), one for rinsing the wafers with pure water, and those for drying the wafers, respectively. In this example, the vessel leading the processing vessel is equivalent to the first wash unit while the vessel following the processing vessel is equivalent to the second wash unit. Besides the vessels as explained above, additional vessels may be employed to wash and dry the holding arms in the wafer carrier mechanisms R1 and R3.

In such semiconductor manufacturing apparatus, the wafers transferred from the loader unit 62 to the wafer carrier mechanisms (R1 through R3) are immersed into the liquids within the processing vessels (T1 through T6) one after another to complete a sequence of procedures of the washing to remove particles of the impurities from the wafers, producing the protection films on the wafers, rinsing the wafers, and so forth. Transfer of the wafers between adjacent ones of the wafer carrier mechanisms are performed with intermediate counters intervening between them. The empty cassette C from which the wafers have been removed is sent to the carry-out unit 300 by a carrier mechanism not shown.

Alternatively, the processing unit where the protection film is formed on the wafer as mentioned above may be replaced with a single wafer processing unit where the wafers are spun and processed one by one, as shown in FIG. 7. Referring to FIG. 7, reference numeral 71 refers to a cup, 72 to a spinning chuck rotated along a horizontal surface by a motor M, 73 to an elevator unit which raises the spinning chuck, and 74 to an evacuating conduit. Additionally, reference numeral 75 designates a nozzle placed at a tip of a supply conduit 76 and held by a grip arm 77. A chemical applying unit also serves as a wash unit, where once being fixed to the spinning chuck 72, a wafer W is rotated by the spinning chuck 72 while keeping its surface in contact with a wash brush 78, and the wash brush 78 cleans the wafer W with liquid cleaner such as pure water being supplied from the nozzle 75 to and around the center of the wafer. Then, chemical is applied to and around the center of the wafer W to form the protection film, and it is spread over the surface of the wafer W by means of spin coating. A plurality of nozzles attached to a plurality of supply conduits are ready adjacent to the cup 71, and the grip arm 77 grasps and transfers one of the nozzles to a position above the wafer W to exchange the formerly used nozzle with the new one.

FIG. 8 is a schematic plan view illustrating an embodiment of a semiconductor manufacturing apparatus having the above-mentioned single wafer processing unit (used to apply, spread, and wash the chemical) incorporated therein. The apparatus includes a cassette station 8 which can be loaded with many (e.g. four) wafer cassettes C. Wafers W enveloped in the wafer cassettes C are removed and transferred to an intermediate counter 82 by a transfer arm 81 which is a transfer mechanism movable in X-, Y-, θ-(horizontally rotational), and Z-(vertical) directions. Behind the intermediate counter 82, a main arm is slidably placed, and the processing nits 84 as mentioned above are arranged on opposite sides of a slide path of the main arm 83. The wafers W on the intermediate counter 82 are carried in the processing units 84 by the main arm 83 to undergo the above stated treatments. In this embodiment, a carrier unit is comprised of the transfer arm 81, the intermediate counter 82, and the main arm 83. Although the processing units 84 are dedicated to both the tasks of the washing and the application of the chemical to form the protection film in this embodiment, alternatively, the series of tasks may be carried out by several separate units including the one using a wash brush to remove particles of the impurities, the one for applying and spreading the chemical, the one for washing the wafers after the previous task, and so forth. The means for applying the chemical to the substrate may be replaced with the one in which the chemical is sprayed onto the substrate.

As already explained, since the unit used to form the protection film is incorporated in the semiconductor manufacturing apparatus according to the present invention, a space occupied by the apparatus is reduced as a whole in comparison with a case where the protection film forming unit is provided separate from the apparatus, and this is effective in saving space within the clean room. The tasks of the washing and the forming the protection film can be carried out continuously, and this brings about enhanced throughput and results in the washing unit being additionally more valuable in a system is suitable for a damascene process.

Also, according to the present invention, when copper is selected for wiring, it is desirable, in a means of forming metal protection film (coat) which is to prevent copper ions from diffusing from the surface of copper wiring into the interlayer insulating film, that a compound to be applied to the copper surface is selected among materials that contains components that relatively freely react with copper to produce alloy, including stannous chloride ($SnCl_2$), stannous boron fluoride ($Sn(BF_4)_2$), stannous sulfate ($SnSO_4$), nickel sulfate ($NiSO_4$), nickel chloride ($NiCl_2$), nickel sulfaminate ($NiHSO_3NH_2$). Also, in such a procedure, first solution containing a metal salt is first applied to the substrate surface, and then, the substrate surface is washed. As to the formation of the protection film, if the wiring metal has a surface of metal, the protection film is formed by means of electroless plating; specifically, if the solution containing stannous chloride is used, the copper is superposed with Sn-Cu layer which serves as the protection film to prevent the copper from diffusing into the insulating film.

As to the damascene process, in addition to a single damascene process, a dual damascene process may be applied where wiring in the circuitry at the (n+1)th level and wiring in the through-holes are simultaneously embedded. The metal layer may be formed of platinum or gold instead of copper, and the insulating film may be a $SiO_2$ film or a SiOF film, for example.

As described above, in the semiconductor device manufacturing method according to the present invention, reliability on the resultant device is enhanced by using the damascene process in embedding wiring to prevent diffusion of metal ions, and the manufacturing procedure can be simplified. Also, in the semiconductor device manufacturing apparatus according to the present invention, the tasks of washing the substrates and forming the protection film on the metal layer on the substrate can be carried out continuously, and this leads to enhanced throughput and effective down-sizing of the equipment and plant.

What is claimed is:
1. A method of manufacturing a semiconductor device, comprising the steps of:
   making a first concavity in a first insulating film of the device;

covering an inside surface of the first concavity and an upper surface of the first insulating film with a first barrier layer for preventing metal diffusion;

buying the first concavity covered with the first barrier layer with a wiring metal;

polishing the device to remove a part of the wiring metal residing higher than a level of the upper surface of the first insulating film so as to leave a first metal layer in the first concavity;

applying a solution of an organic substance to the device so as to form a protective film of the organic substance on a surface of the first metal layer for preventing metal diffusion;

forming a second insulating film on the surface of the device, the second insulating film contacting the upper surface of the first insulating film from which the first barrier layer is removed, the second insulating film contacting the protective film, making a second concavity simultaneously in the second insulating film and the protective film in a region above the first metal layer;

covering the inside surface of the second concavity and the upper surface of the second insulating film with a second barrier layer; and burying the second concavity covered with the second barrier layer with a second wiring metal layer, the second wiring metal layer contacting the first metal layer.

2. The method of claim 1, wherein the organic substance is a triazole compound.

3. The method of claim 1, wherein the organic substance is selected from the group consisting of alicyclic alcohol compounds, saccharides, aromatic ring phenol compounds, aromatic ring carboxylic acid compounds, aliphatic carboxylic acid compounds and derivatives thereof, aminopolycarboxylic acid compounds, phosphoric acid compounds, alkanolamine compounds, aromatic ring amine compounds and aliphatic amine compounds.

4. The method of claim 1, wherein the wiring metal is copper.

5. The method of claim 1, further comprising washing the device to eliminate particles therefrom, after the polishing.

6. The method of claim 1, wherein the protective film is formed on and removed from the upper surface of the first insulating film.

7. The method of claim 1, wherein the protective film is formed on and removed from the first barrier layer.

* * * * *

UNITED STATES PATENT AND TRADEMARK OFFICE
CERTIFICATE OF CORRECTION

PATENT NO. : 6,838,370 B1
DATED : January 4, 2005
INVENTOR(S) : Takayuki Niuya et al.

It is certified that error appears in the above-identified patent and that said Letters Patent is hereby corrected as shown below:

Column 9,
Line 4, "buying" should read -- burying --.
Line 19, "film," should read -- film; --.

Signed and Sealed this

Twenty-fourth Day of May, 2005

JON W. DUDAS
*Director of the United States Patent and Trademark Office*